(12) United States Patent
Yang et al.

(10) Patent No.: US 12,189,287 B2
(45) Date of Patent: Jan. 7, 2025

(54) PHOTORESIST COMPOSITION AND METHOD OF FORMING PHOTORESIST PATTERN

(71) Applicant: TAIWAN SEMICONDUCTOR MANUFACTURING COMPANY, LTD., Hsinchu (TW)

(72) Inventors: Li-Po Yang, Hsinchu (TW); Wei-Han Lai, New Taipei (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/208,794

(22) Filed: Jun. 12, 2023

(65) Prior Publication Data
US 2023/0324796 A1  Oct. 12, 2023

Related U.S. Application Data

(63) Continuation of application No. 17/147,424, filed on Jan. 12, 2021.
(Continued)

(51) Int. Cl.
*G03F 7/004* (2006.01)
*C08F 212/14* (2006.01)
(Continued)

(52) U.S. Cl.
CPC .......... *G03F 7/0045* (2013.01); *C08F 212/24* (2020.02); *C08F 220/382* (2020.02);
(Continued)

(58) Field of Classification Search
CPC .... C08F 212/24; C08F 212/22; C08F 212/22; C08F 212/30; C08F 212/301;
(Continued)

(56) References Cited

U.S. PATENT DOCUMENTS 8,673,538 B2   3/2014   Inasaki et al.
8,785,105 B2   7/2014   Ohsawa et al.
(Continued)

FOREIGN PATENT DOCUMENTS

EP   2112554 81       6/2012
EP   3258317 A1      12/2017
(Continued)

OTHER PUBLICATIONS

Notice of Allowance issued in U.S. Appl. No. 17/147,424, dated Mar. 10, 2023.
(Continued)

*Primary Examiner* — Amanda C. Walke
(74) *Attorney, Agent, or Firm* — STUDEBAKER & BRACKETT PC

(57) ABSTRACT

Method of forming pattern in photoresist layer includes forming photoresist layer over substrate, selectively exposing photoresist layer to actinic radiation forming latent pattern. Latent pattern is developed by applying developer to form pattern. Photoresist layer includes photoresist composition including polymer:

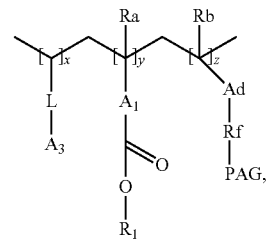

$A_1$, $A_2$, L are direct bond, C4-C30 aromatic, C4-C30 alkyl, C4-C30 cycloalkyl, C4-C30 hydroxylalkyl, C4-C30 alkoxy,
(Continued)

C4-C30 alkoxyl alkyl, C4-C30 acetyl, C4-C30 acetylalkyl, C4-C30 alkyl carboxyl, C4-C30 cycloalkyl carboxyl, C4-C30 hydrocarbon ring, C4-C30 heterocyclic, —COO—, A1 and A2 are not both direct bonds, and are unsubstituted or substituted with a halogen, carbonyl, or hydroxyl; $A_3$ is C6-C14 aromatic, wherein $A_3$ is unsubstituted or substituted with halogen, carbonyl, or hydroxyl; $R_1$ is acid labile group; Ra, Rb are H or C1-C3 alkyl; $R_f$ is direct bond or C1-C5 fluorocarbon; PAG is photoacid generator; $0<x/(x+y+z)<1$, $0<y/(x+y+z)<1$, and $0<z/(x+y+z)<1$.

20 Claims, 16 Drawing Sheets

Related U.S. Application Data

(60) Provisional application No. 63/041,070, filed on Jun. 18, 2020.

(51) Int. Cl.
| | | |
|---|---|---|
| *C08F 220/38* | (2006.01) | |
| *G03F 7/038* | (2006.01) | |
| *G03F 7/039* | (2006.01) | |
| *G03F 7/16* | (2006.01) | |
| *G03F 7/20* | (2006.01) | |
| *G03F 7/36* | (2006.01) | |
| *G03F 7/38* | (2006.01) | |

(52) U.S. Cl.
CPC .......... *G03F 7/0382* (2013.01); *G03F 7/0392* (2013.01); *G03F 7/168* (2013.01); *G03F 7/20* (2013.01); *G03F 7/36* (2013.01); *G03F 7/38* (2013.01)

(58) Field of Classification Search
CPC ...... C08F 212/38; G03F 7/40; H01L 21/0271; H01L 21/273; H01L 21/30604; C07C 381/12
See application file for complete search history.

(56) References Cited

U.S. PATENT DOCUMENTS

| | | |
|---|---|---|
| 8,796,666 B1 | 8/2014 | Huang et al. |
| 9,052,592 B2 | 6/2015 | Nakamura et al. |
| 9,093,530 B2 | 7/2015 | Huang et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 10,078,264 B2 | 9/2018 | Hatakeyama et al. |
| 11,163,232 B2 | 11/2021 | Hatakeyama et al. |
| 11,262,653 B2 | 3/2022 | Ohashi et al. |
| 2016/0334706 A1 | 11/2016 | Ohashi |
| 2016/0376233 A1 | 12/2016 | Yamazaki et al. |
| 2017/0038683 A1 | 2/2017 | Ohashi et al. |
| 2017/0236720 A1 | 8/2017 | Yaegashi |
| 2017/0242339 A1 | 8/2017 | Hatakeyama et al. |
| 2018/0364574 A1 | 12/2018 | Hatakeyama et al. |
| 2019/0113846 A1 | 4/2019 | Hatakeyama et al. |
| 2020/0218154 A1 | 7/2020 | Sasami et al. |
| 2020/0233300 A1 | 7/2020 | Higo et al. |

FOREIGN PATENT DOCUMENTS

| | | |
|---|---|---|
| TW | 201205191 A | 2/2012 |
| TW | 201437747 A | 10/2014 |
| TW | 201708949 A | 3/2017 |

OTHER PUBLICATIONS

Non-Final Office Action issued in U.S. Appl. No. 17/147,424, dated Oct. 17, 2022.

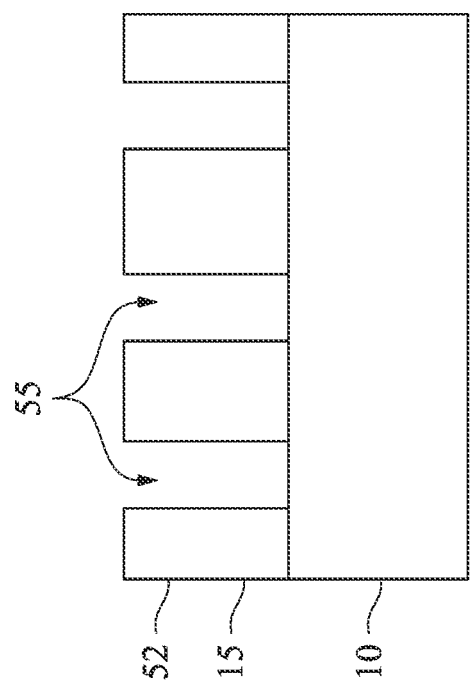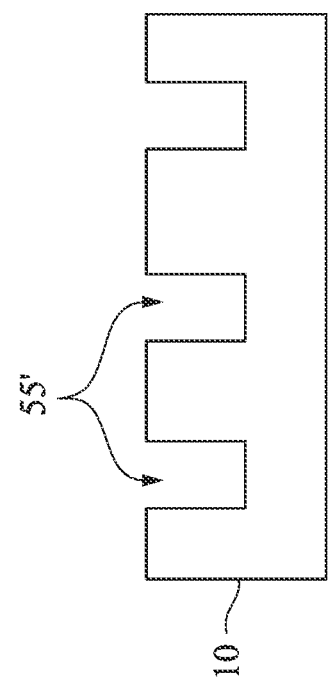

PHOTORESIST COMPOSITION AND METHOD OF FORMING PHOTORESIST PATTERN

CROSS-REFERENCE TO RELATED APPLICATIONS

This application is a continuation application of U.S. application Ser. No. 17/147,424, filed Jan. 12, 2021, which claims priority to U.S. Provisional Patent Application No. 63/041,070, filed Jun. 18, 2020, the entire disclosures of each of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL an increase in wafer exposure throughput is desirable. Wafer exposure throughput can be improved through increased exposure power or increased resist photospeed. Low exposure dose may lead to increased line width roughness and reduced critical dimension uniformity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5 shows a process stage of a sequential operation according to an embodiment of the disclosure.

FIG. 6 shows a process stage of a sequential operation according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
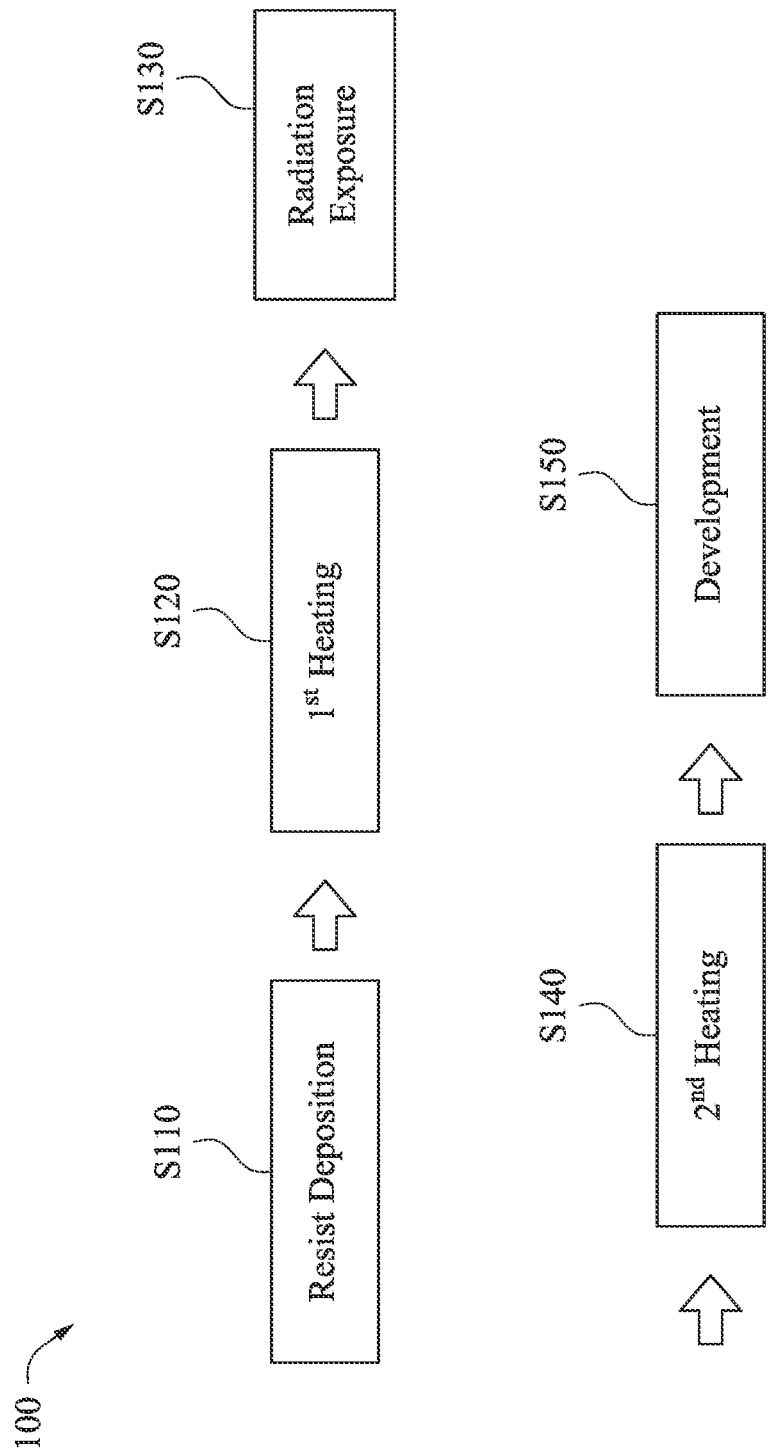
FIG. 1 illustrates a process flow of manufacturing a semiconductor device according to embodiments of the disclosure.
Figure 2:
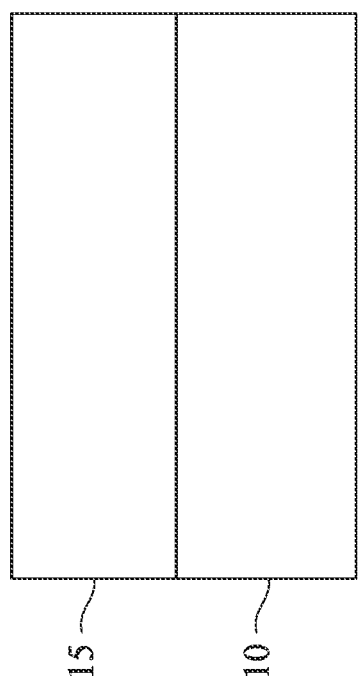
FIG. 2 shows a process stage of a sequential operation according to an embodiment of the disclosure.

FIG. 1 illustrates a process flow 100 of manufacturing a semiconductor device according to embodiments of the disclosure. A photoresist is coated on a surface of a layer to be patterned or a substrate 10 in operation S110, in some embodiments, to form a photoresist layer 15, as shown in FIG. 2. Then the photoresist layer 15 undergoes a first baking operation S120 to evaporate solvents in the photoresist composition in some embodiments. The photoresist layer 15 is baked at a temperature and time sufficient to cure and dry the photoresist layer 15. In some embodiments, the photoresist layer is heated to a temperature of about 40° C. and 120° C. for about 10 seconds to about 10 minutes.

After the first baking operation S120, the photoresist layer 15 is selectively exposed to actinic radiation 45/97 (see FIGS. 3A and 3B) in operation S130. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the radiation is an electron beam.

Figure 3A:
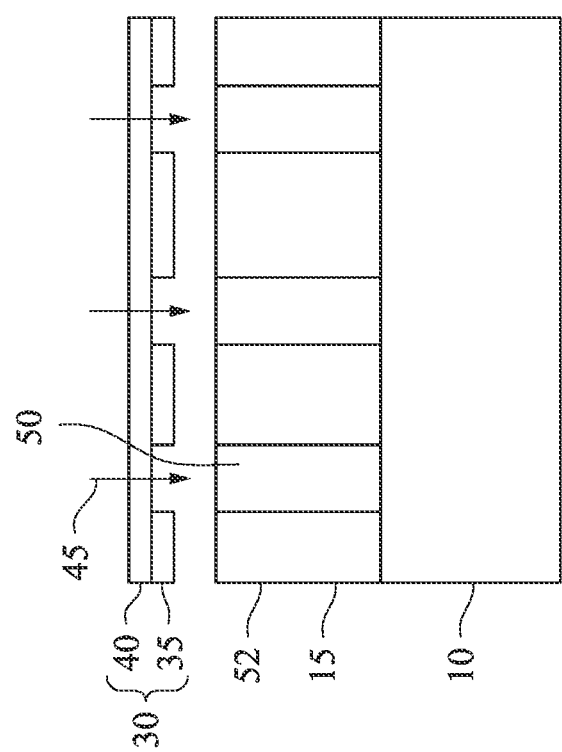
FIGS. 3A and 3B show a process stage of a sequential operation according to an embodiment of the disclosure.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
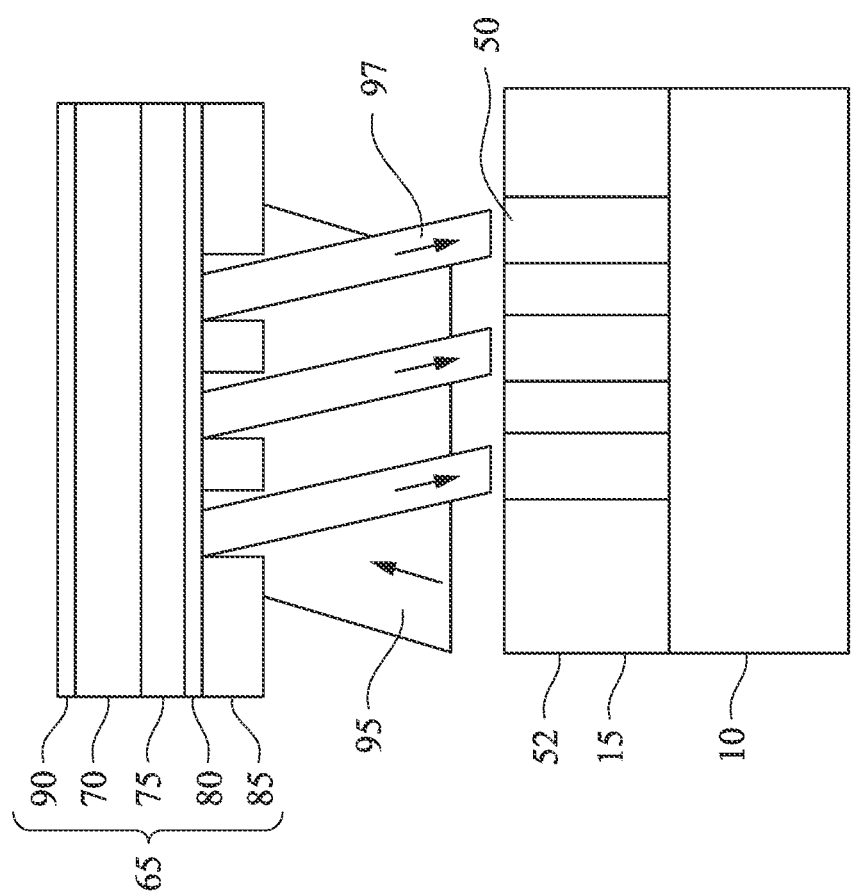

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

The region of the photoresist layer exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction.

Next, the photoresist layer 15 undergoes a post-exposure bake in operation S140. In some embodiments, the photoresist layer 15 is heated to a temperature of about 50° C. and 160° C. for about 20 seconds to about 10 minutes. In some embodiments, the photoresist layer 15 is heated for about 30 seconds to about 5 minutes. In some embodiments, the photoresist layer 15 is heated for about 1 minute to about 2 minutes. The post-exposure baking may be used in order to assist in the generating, dispersing, and reacting of the acid/base/free radical generated from the impingement of the radiation 45/97 upon the photoresist layer 15 during the exposure. Such assistance helps to create or enhance chemical reactions, which generate chemical differences between the exposed region 50 and the unexposed region 52 within the photoresist layer. These chemical differences also cause differences in the solubility between the exposed region 50 and the unexposed region 52.

Figure 4:
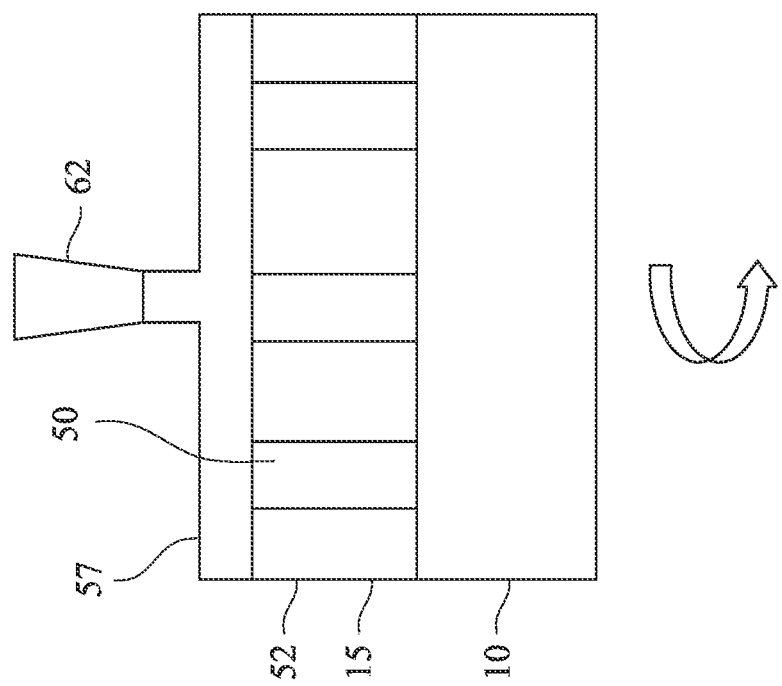
FIG. 4 shows a process stage of a sequential operation according to an embodiment of the disclosure.

The selectively exposed photoresist layer is subsequently developed by applying a developer to the selectively exposed photoresist layer in operation S150. As shown in FIG. 4, a developer 57 is supplied from a dispenser 62 to the photoresist layer 15. In some embodiments where the photoresist is a positive-tone photoresist, the exposed portion of the photoresist layer 50 is removed by the developer 57 forming a pattern of openings 55 in the photoresist layer 15 to expose the substrate 10, as shown in FIG. 5.

In some embodiments, the pattern of openings 55 in the photoresist layer 15 are extended into the layer to be patterned or substrate 10 to create a pattern of openings 55' in the substrate 10, thereby transferring the pattern in the photoresist layer 15 into the substrate 10, as shown in FIG. 6. The pattern is extended into the substrate by etching, using one or more suitable etchants. The unexposed photoresist layer 15 is at least partially removed during the etching operation in some embodiments. In other embodiments, the unexposed photoresist layer 15 is removed after etching the substrate 10 by using a suitable photoresist stripper solvent or by a photoresist ashing operation.

In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal-nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. In some embodiments, the photoresist is a positive tone resist. A positive tone resist refers to a photoresist material that when exposed to radiation, such as UV light, becomes soluble in a developer, while the region of the photoresist that is non-exposed (or exposed less) is insoluble in the developer. In other embodiments, the photoresist is a negative tone resist. A negative tone resist refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive photoresists provide a positive pattern, (i.e. —the exposed regions are removed by the developer), when the developer is an aqueous-based developer, such as a tetramethylammonium hydroxide (TMAH) solution. On the other hand, the same photoresist provides a negative pattern (i.e. —the unexposed regions are removed by the developer) when the developer is an organic solvent, such as n-butyl acetate (nBA). Further, whether a resist is a positive or negative tone may depend on the polymer. For example in some resists developed with the TMAH solution, the unexposed regions of the photoresist are removed by the TMAH, and the exposed regions of the photoresist, that undergo cross-linking upon exposure to actinic radiation, remain on the substrate after development.

Figure 7:
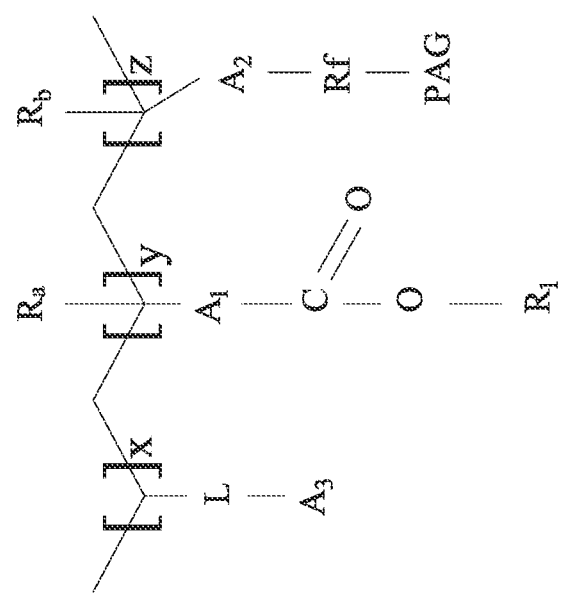
FIG. 7 shows a polymer for a photoresist composition according to embodiments of the disclosure.

In some embodiments, the photoresist composition includes a polymer, having the formula shown in FIG. 7. In some embodiments, the polymer has a formula:

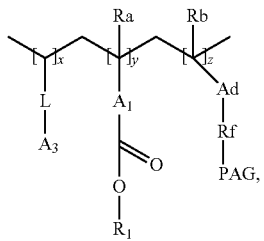

where $A_1$, $A_2$, and L are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, wherein $A_1$ and $A_2$ are not both direct bonds, wherein $A_1$ and $A_2$ are unsubstituted or substituted with a halogen, carbonyl group, or hydroxyl group. In some embodiments, $A_3$ is a C6-C14 aromatic group, wherein $A_3$ is unsubstituted or substituted with a halogen, carbonyl group, or hydroxyl group, $R_1$ is an acid labile group, Ra and Rb are independently H or a C1-C3 alkyl group, and $R_f$ is a direct bond or a C1-C5 fluorocarbon. PAG is a photoacid generator, and $0 \leq x/(x+y+z) \leq 1$, $0 \leq y/(x+y+z) \leq 1$, and $0 \leq z/(x+y+z) \leq 1$.

In some embodiments, $A_1$, $A_2$, and $A_3$ are independently a chain, ring, or three-dimensional structure. In some embodiments, the three-dimensional structure is an adamantyl or norbornyl structure. In some embodiments, $A_1$, $A_2$, and $A_3$ are independently a phenyl group or a naphthalenyl group. In some embodiments, the $A_1$, $A_2$, and $A_3$ groups impart etching resistance to the polymer.

In some embodiments, $R_1$ is a C4-C15 alkyl group, a C4-C15 cycloalkyl group, a C4-C15 hydroxylalkyl group, a C4-C15 alkoxy group, or a C4-C15 alkoxyl alkyl group. In some embodiments, $R_1$ is a tert-butyl group.

In some embodiments, $R_f$ is a perfluorinated group.

In some embodiments, $A_3$ is a phenol group, a hydroxynaphthalene group, or a hydroxyanthracene group.

In some embodiments, the polymer has a weight average molecular weight ranging from 500 to 1,000,000. In some embodiments, the polymer has a weight average molecular weight ranging from 2,000 to 250,000.

In some embodiments, L is a direct bond, $A_3$ is a p-phenol group, and $0.2 \leq x/(x+y+z) \leq 0.5$.

In some embodiments, $A_1$ is not a direct bond and $0.2 \leq y/(x+y+z) \leq 0.7$. In some embodiments, $A_2$ is not a direct bond and $0.05 \leq z/(x+y+z) \leq 0.5$. In some embodiments, $0.1 \leq x/(x+y+z) \leq 0.5$. In some embodiments, $A_1$ and $A_2$ are not direct bonds and $0.2 \leq y/(x+y+z) \leq 0.7$ and $0.05 \leq z/(x+y+z) \leq 0.5$. In some embodiments, $A_1$ is not a direct bond and $0.2 \leq y/(x+y+z) \leq 0.7$ and $0.1 \leq x/(x+y+z) \leq 0.5$. In some embodiments, $A_1$ and $A_2$ are not direct bonds and $0.2 \leq y/(x+y+z) \leq 0.7$, $0.05 \leq z/(x+y+z) \leq 0.5$, and $0.1 \leq x/(x+y+z) \leq 0.5$.

In some embodiments, the photoacid generator group PAG includes a triarylsulfonium group, diaryliodonium group, trifluoromethanesulfonate group, or iodonium sulfonate group. In some embodiments, the photoacid generator group includes a triphenylsulfonium group and a sulfonate group.

In some embodiments, the photoresist composition includes one or more photoactive compounds (PAC) in addition to the PAG group attached to the polymer or instead of the PAG group attached to the polymer.

In some embodiments, the PACs include photoacid generators, photobase generators, photo decomposable bases, free-radical generators, or the like. In some embodiments in which the PACs are photoacid generators, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer; combinations of these, or the like.

In some embodiments, the photoresist composition includes a photoactive compound, wherein $A_1$ is not a direct bond and $0.2 \le y/(x+y+z) \le 0.7$. In some embodiments, the photoresist composition includes a photoactive compound and $0.1 \le x/(x+y+z) \le 0.5$. In some embodiments, the photoresist composition includes a photoactive compound, wherein $A_1$ is not a direct bond and $0.2 \le y/(x+y+z) \le 0.7$ and $0.1 \le x/(x+y+z) \le 0.5$.

The $R_1$ group on the polymer decomposes or is cleaved when exposed to the acid generated by the PAG group, or to an acid, base, or free radical generated by the PAC. If the $R_1$ is decomposed or cleaved by an acid, it is known as an acid labile group (ALG). In some embodiments, the $R_1$ group which will decompose is a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl)imido group, a bis(alkylcarbonyl)methylene group, a bis(alkylcarbonyl)imido group, a bis(alkylsulfonyl)methylene group, a bis(alkylsulfonyl) imido group, a tris(alkylcarbonyl) methylene group, a tris (alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

Figure 8:
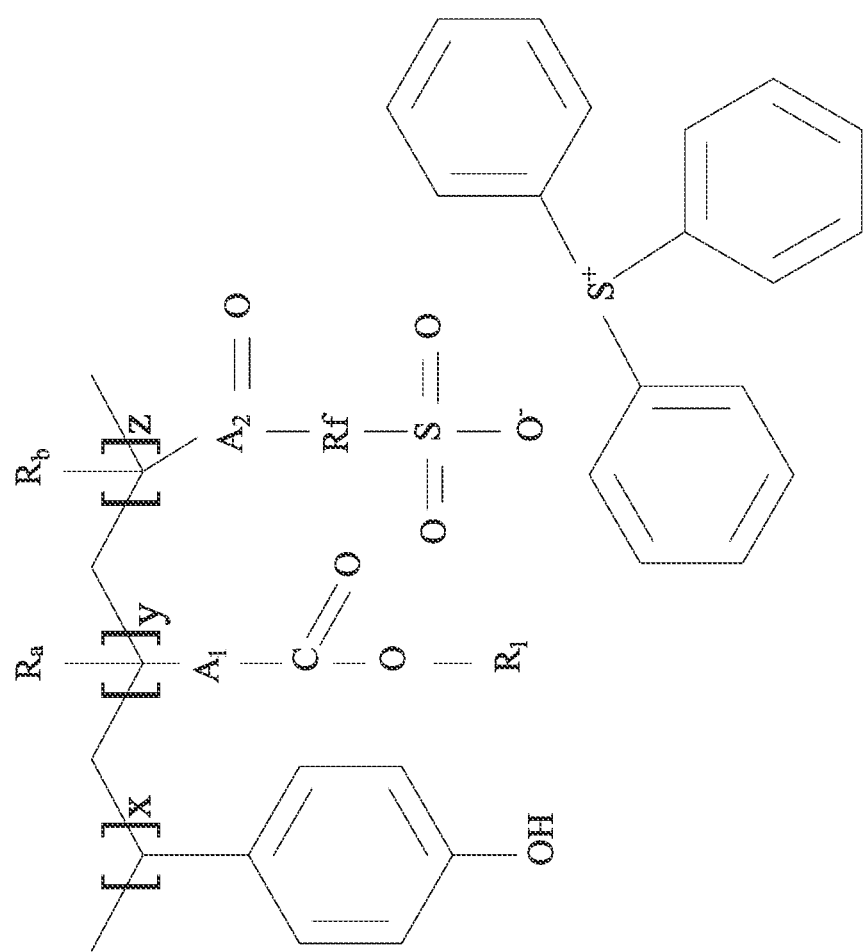
FIG. 8 shows a polymer for a photoresist composition according to embodiments of the disclosure.

FIG. 8 shows a polymer for a photoresist composition according to some embodiments of the disclosure. As shown in FIG. 8, L is a direct bond, $A_3$ is a p-phenol group, and the PAG group includes a sulfonate anion and a triphenyl sulfonium cation.

Figure 9B:
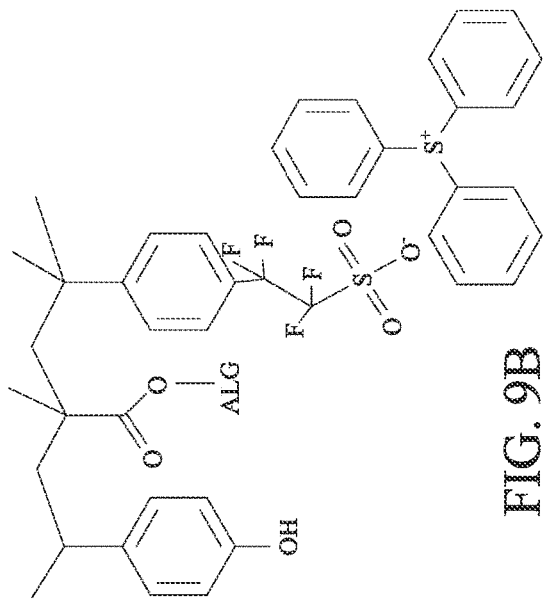
FIGS. 9A, 9B, and 9C show polymers for photoresist compositions according to embodiments of the disclosure.
Figure 9C:
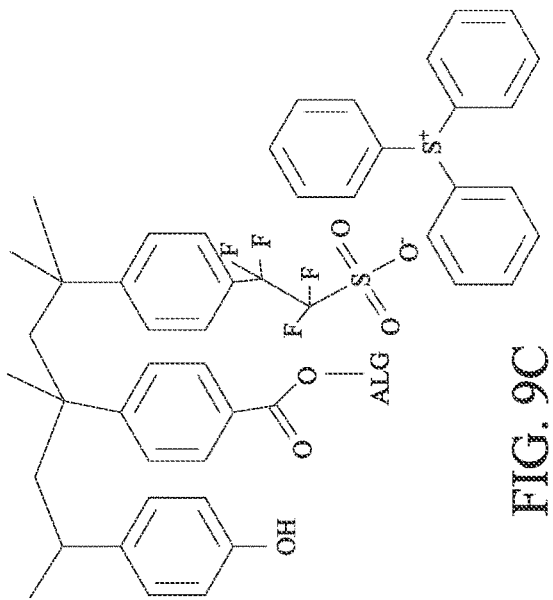
Figure 9A:
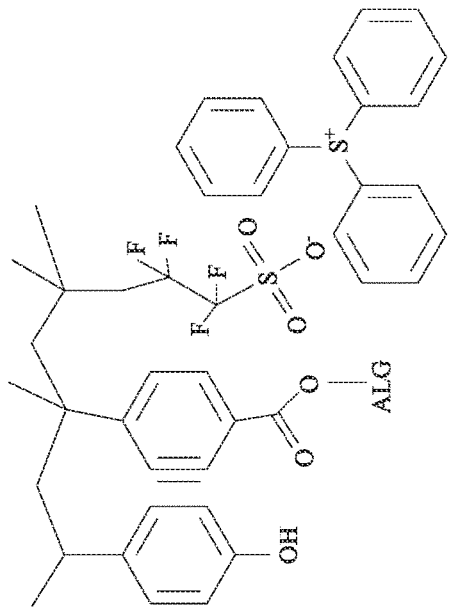

FIGS. 9A, 9B, and 9C show polymers for photoresist compositions according to embodiments of the disclosure. In FIG. 9A, the etching resistance of the polymer is improved when $A_1$ is a phenyl group, while in FIG. 9B the etching resistance of the polymer is improved when $A_2$ is a phenyl group. While in some embodiments, as shown in FIG. 9C, improved etching resistance is provided when both $A_1$ and $A_2$ are phenyl groups.

Figure 10A:
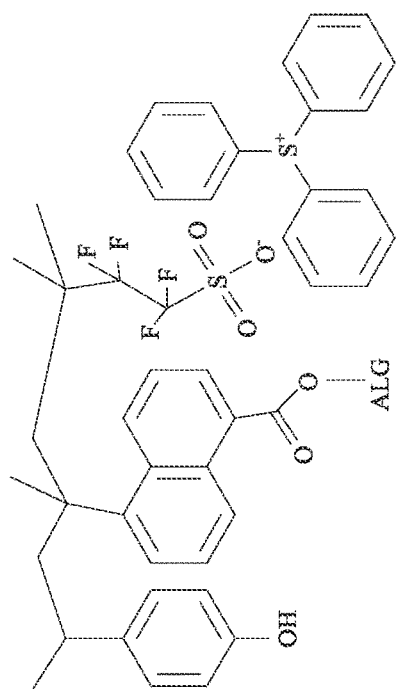
FIGS. 10A, 10B, and 10C show polymers for photoresist compositions according to embodiments of the disclosure.
Figure 10B:
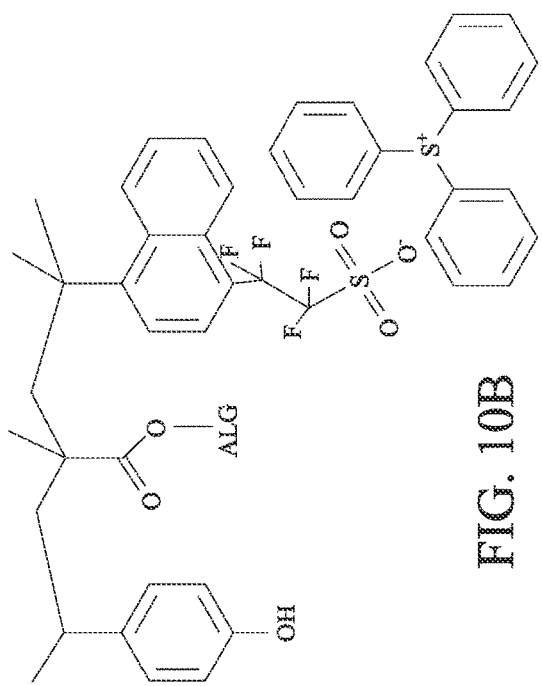
Figure 10C:
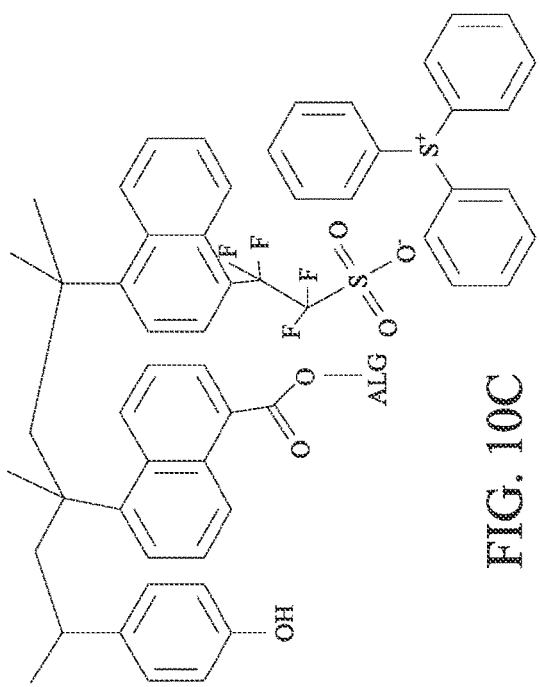

FIGS. 10A, 10B, and 10C show polymers for photoresist compositions according to embodiments of the disclosure. In FIG. 10A, etching resistance of the polymer is improved when $A_1$ is a naphthalenyl group, while in FIG. 10B the etching resistance of the polymer is improved when $A_2$ is a naphthalenyl group. While in some embodiments, as shown in FIG. 10C, improved etching resistance is provided when both $A_1$ and $A_2$ are naphthalenyl groups.

Figure 11B:
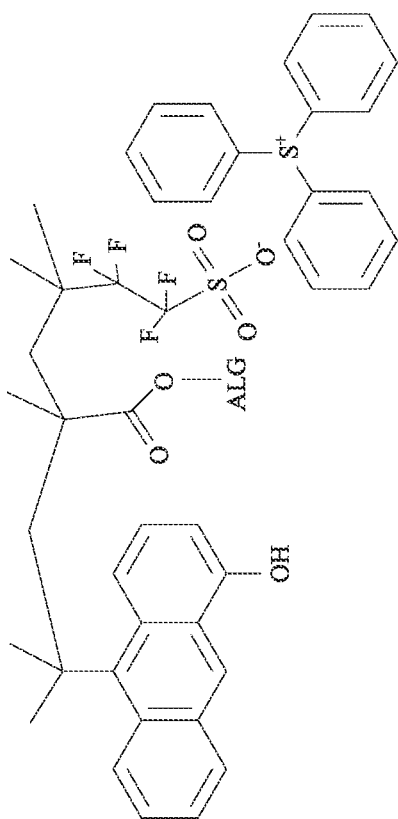
FIGS. 11A, 11B, 11C, and 11D show polymers for photoresist compositions according to embodiments of the disclosure.
Figure 11D:
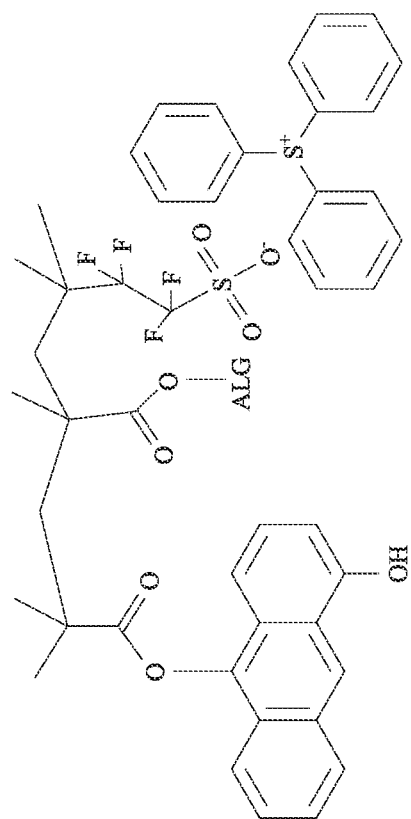
Figure 11A:
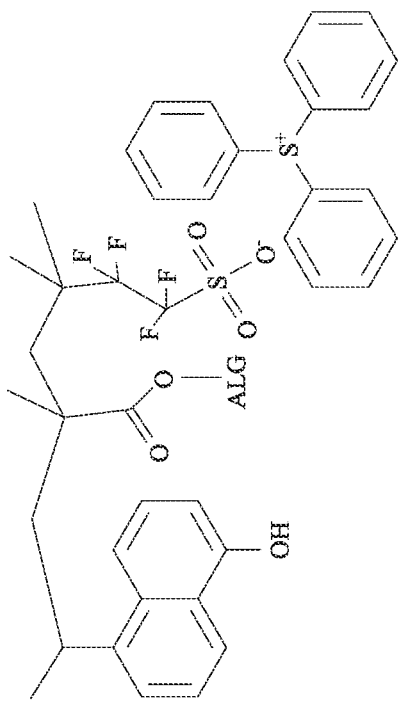
Figure 11C:
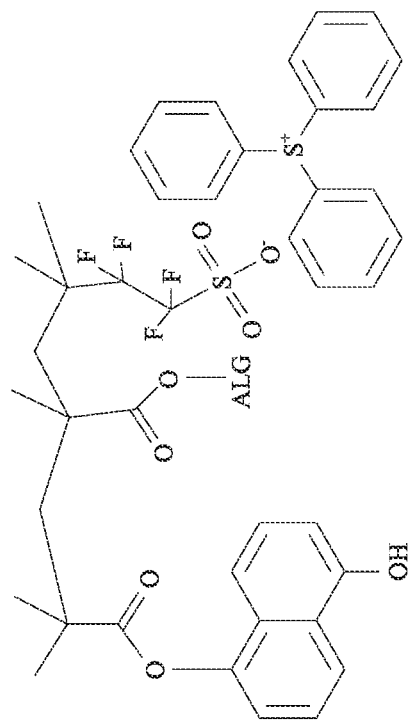

FIGS. 11A, 11B, 11C, and 11D show polymers for photoresist compositions according to embodiments of the disclosure. In FIG. 11A, the etching resistance of the polymer is improved when L is direct bond and $A_3$ is a hydroxynaphthalenyl group, while in FIG. 11B the etching resistance of the polymer is improved when L is a direct bond and $A_3$ is a hydroxyanthracenyl group. In some embodiments, as shown in FIG. 11C, improved etching resistance is provided when L is a —COO— group and $A_3$ is a hydroxynaphthalenyl group, while in some embodiments, as shown in FIG. 11D, improved etching resistance is provided when L is a —COO— group and $A_3$ is a hydroxyanthracenyl group.

In some embodiments, photoresist compositions according to the present disclosure include a metal oxide nanoparticle and one or more organic ligands. In some embodiments, the metal oxide nanoparticle is an organometallic including one or more metal oxide nanoparticles selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof. As used herein, nanoparticles are particles having an average particle size between about 1 nm and about 20 nm. In some embodiments, the metal oxide nanoparticles have an average particle size between about 2 nm and about 5 nm. In some embodiments, the amount of metal oxide nanoparticles in the photoresist composition ranges from about 1 wt. % to about 15 wt. % based on the weight of the first solvent. In some embodiments, the amount of nanoparticles in the photoresist composition ranges from about 5 wt. % to about 10 wt. % based on the weight of the first solvent. Below about 1 wt. % metal oxide nanoparticles the photoresist coating is too thin. Above about 15 wt. % metal oxide nanoparticles the photoresist coating is too thick.

In some embodiments, the metal oxide nanoparticles are complexed with a ligand. In some embodiments, the ligand is a carboxylic acid or sulfonic acid ligand. For example, in some embodiments, zirconium oxide or hafnium oxide nanoparticles are complexed with methacrylic acid forming hafnium methacrylic acid (HfMAA) or zirconium (ZrMAA) methacrylic acid. In some embodiments, the metal oxide nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen.

In some embodiments, the photoresist composition includes about 0.1 wt. % to about 20 wt. % of the ligand. In some embodiments, the photoresist includes about 1 wt. % to about 10 wt. % of the ligand. In some embodiments, the ligand concentration is about 10 wt. % to about 40 wt. % based on the weight of the metal oxide nanoparticles. Below about 10 wt. % ligand the organometallic photoresist does not function well. Above about 40 wt. % ligand it is hard to form the photoresist layer. In some embodiments, the ligand is HfMAA or ZrMAA dissolved at about a 5 wt. % to about 10 wt. % weight range in a coating solvent, such as propylene glycol methyl ether acetate (PGMEA).

In some embodiments, the polymer and any desired additives or other agents, are added to the solvent for application. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

The solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

In some embodiments, the photoresist composition further includes water at a concentration of 10 ppm to 250 ppm based on the total composition of the water, any additives, and the solvent.

In some embodiments, the photoresist composition includes the polymer along with one or more photoactive compounds (PACs). In some embodiments, the polymer includes one or more groups that will decompose (e.g., acid labile groups) or otherwise react when mixed with acids, bases, or free radicals generated by the PACs (as further described below).

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group which will decompose includes structures such as 1-adamantyl (meth)acrylate, tricyclodecanyl (meth)acrylate, cyclohexyl (meth)acrylate, combinations of these, or the like.

In some embodiments, the photoresist composition includes a quencher to inhibit diffusion of the generated acids/bases/free radicals within the photoresist. The quencher improves the resist pattern configuration as well as the stability of the photoresist over time. In an embodiment, the quencher is an amine, such as a secondary lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, including phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phenylphosphinic acid.

In some embodiments, the quenchers include photobase generators and photo decomposable bases. In embodiments in which the quenchers are photobase generators (PBG), the PBGs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

In some embodiments, the quencher is a photo decomposable bases (PBD), such as triphenylsulfonium hydroxide.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

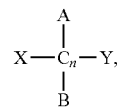

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

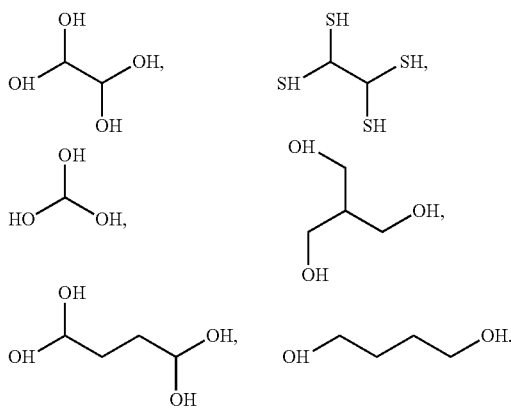

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

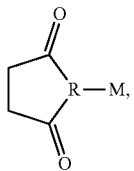

where R is a carbon atom, a nitrogen atom, a sulfur atom, or an oxygen atom; M includes a chlorine atom, a bromine atom, an iodine atom, —NO$_2$; —SO$_3$—; —H—; —CN; —NCO, —OCN; —CO$_2$—; —OH; —OR*, —OC(O)CR*; —SR, —SO$_2$N(R*)$_2$; —SO$_2$R*; SOR; —OC(O)R*; —C(O) OR*; —C(O)R*; —Si(OR*)$_3$; —Si(R*)$_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

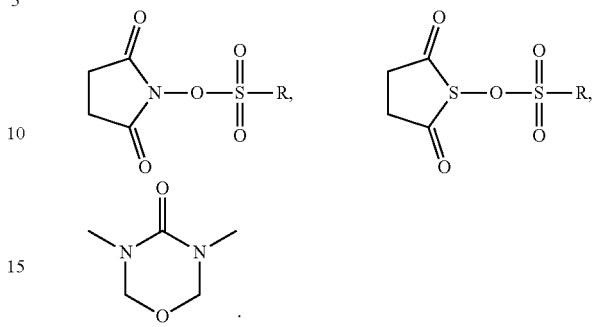

The individual components of the photoresist are placed into a solvent in order to aid in the mixing and dispensing of the photoresist. To aid in the mixing and dispensing of the photoresist, the solvent is chosen at least in part based upon the materials chosen for the polymer resin as well as PACs or other additives. In some embodiments, the solvent is chosen such that the polymer resin and additives can be evenly dissolved into the solvent and dispensed upon the layer to be patterned.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and aryl-ammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent helps observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2',4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, crystal violet, titanium oxide, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxpteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxy silane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

In some embodiments, the polymer, along with any desired additives or other agents, are added to the solvent for application. Once added, the mixture is then mixed in order to achieve a homogenous composition throughout the photoresist to ensure that there are no defects caused by uneven mixing or nonhomogenous composition of the photoresist. Once mixed together, the photoresist may either be stored prior to its usage or used immediately.

Once ready, the photoresist is applied onto the layer to be patterned, as shown in FIG. 2, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-bake of the photoresist layer is performed in some embodiments to cure and dry the photoresist prior to radiation exposure (see FIG. 1). The curing and drying of the photoresist layer 15 removes the solvent component while leaving behind the polymer resin, and the other chosen additives, including a PAC, or cross-linking agent. In some embodiments, the pre-baking is performed at a temperature suitable to evaporate the solvent, such as between about 40° C. and 120° C., although the precise temperature depends upon the materials chosen for the photoresist. The pre-baking is performed for a time sufficient to cure and dry the photoresist layer, such as between about 10 seconds to about 10 minutes.

FIGS. 3A and 3B illustrate selective exposures of the photoresist layer to form an exposed region 50 and an unexposed region 52. In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45/97, such as ultraviolet light, to the photoresist layer 15 in order to induce a reaction of the PAG group or PACs, which in turn reacts with the polymer resin to chemically alter those regions of the photoresist layer to which the radiation 45/97 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the photoresist layer 15 has been exposed to the exposure radiation 45, a post-exposure baking is performed in some embodiments to assist in the generating, dispersing, and reacting of the acid generated from the impingement of the radiation 45 upon the PAG group or PAC additives during the exposure. Such thermal assistance helps to create or enhance chemical reactions, which generate chemical differences between the exposed region 50 and the unexposed region 52 within the photoresist layer 15. These chemical differences also cause differences in the solubility between the exposed region 50 and the unexposed region 52. In some embodiments, the post-exposure baking occurs at temperatures ranging from about 50° C. to about 160° C. for a period of between about 20 seconds and about 10 minutes.

The inclusion of the cross-linking agent into the photoresist composition in some embodiments helps the components of the polymer resin (e.g., the individual polymers) react and bond with each other, increasing the molecular weight of the bonded polymer. In some embodiments, an initial polymer has a side chain with a carboxylic acid protected by one of the groups to be removed/acid labile groups. The groups to be removed are removed in a de-protecting reaction, which is initiated by a proton $H^+$ generated by, e.g., the photoacid generator during either the exposure process or during the post-exposure baking process. The $H^+$ first removes the groups to be removed/acid labile groups and another hydrogen atom may replace the removed structure to form a de-protected polymer. Once de-protected, a cross-linking reaction occurs between two separate de-protected polymers that have undergone the de-protecting reaction and the cross-linking agent in a cross-linking reaction. In particular, hydrogen atoms within the carboxylic groups formed by the de-protecting reaction are removed and the oxygen atoms react with and bond with the cross-linking agent. This bonding of the cross-linking agent to two polymers bonds the two polymers not only to the cross-linking agent but also bonds the two polymers to each other through the cross-linking agent, thereby forming a cross-linked polymer.

By increasing the molecular weight of the polymers through the cross-linking reaction, the new cross-linked polymer becomes less soluble in conventional organic solvent negative resist developers.

In some embodiments, the photoresist developer 57 includes a solvent, and an acid or a base. In some embodiments, the concentration of the solvent in the developer is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-exposed regions 50 of the positive tone resist, exposing the surface of the substrate 10, as shown in FIG. 5, and leaving behind well-defined unexposed photoresist regions 52, having improved definition than provided by conventional photoresist photolithography.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 52 is in place. For example, an etching operation, using dry or wet etching, is performed in some embodiments, to transfer the pattern of the photoresist layer 52 to the underlying substrate 10, forming recesses 55' as shown in FIG. 6. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 12:
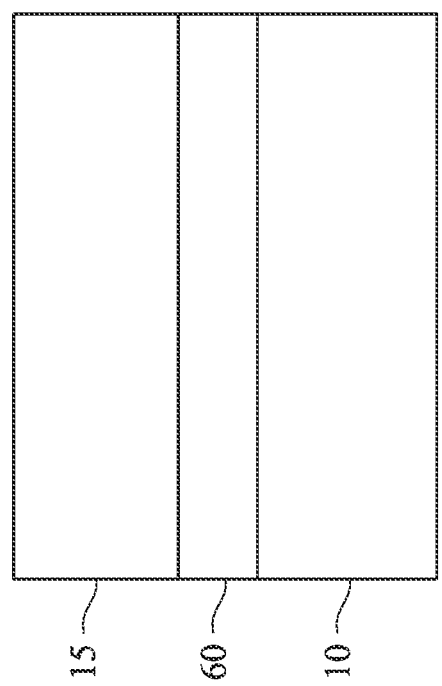
FIG. 12 shows a process stage of a sequential operation according to an embodiment of the disclosure.

In some embodiments, a layer to be patterned 60 is disposed over the substrate prior to forming the photoresist layer, as shown in FIG. 12. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 13A:
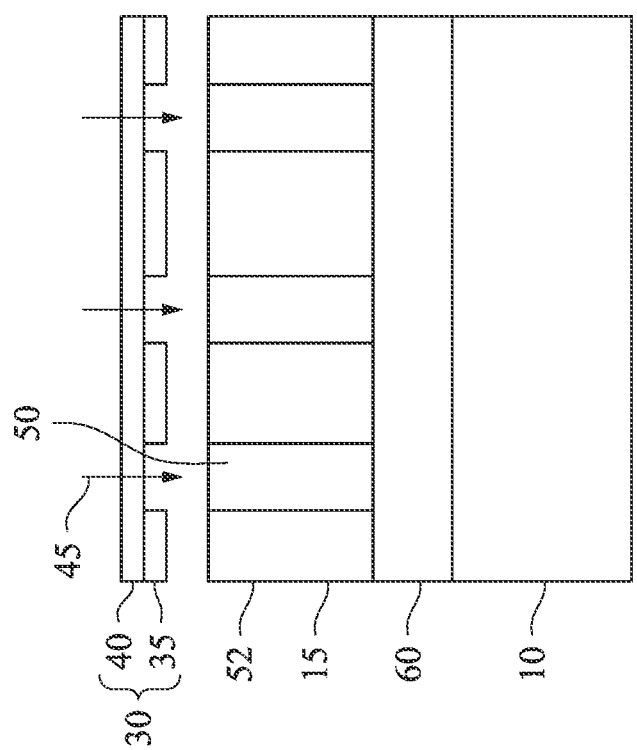
FIGS. 13A and 13B show a process stage of a sequential operation according to an embodiment of the disclosure.
Figure 13B:
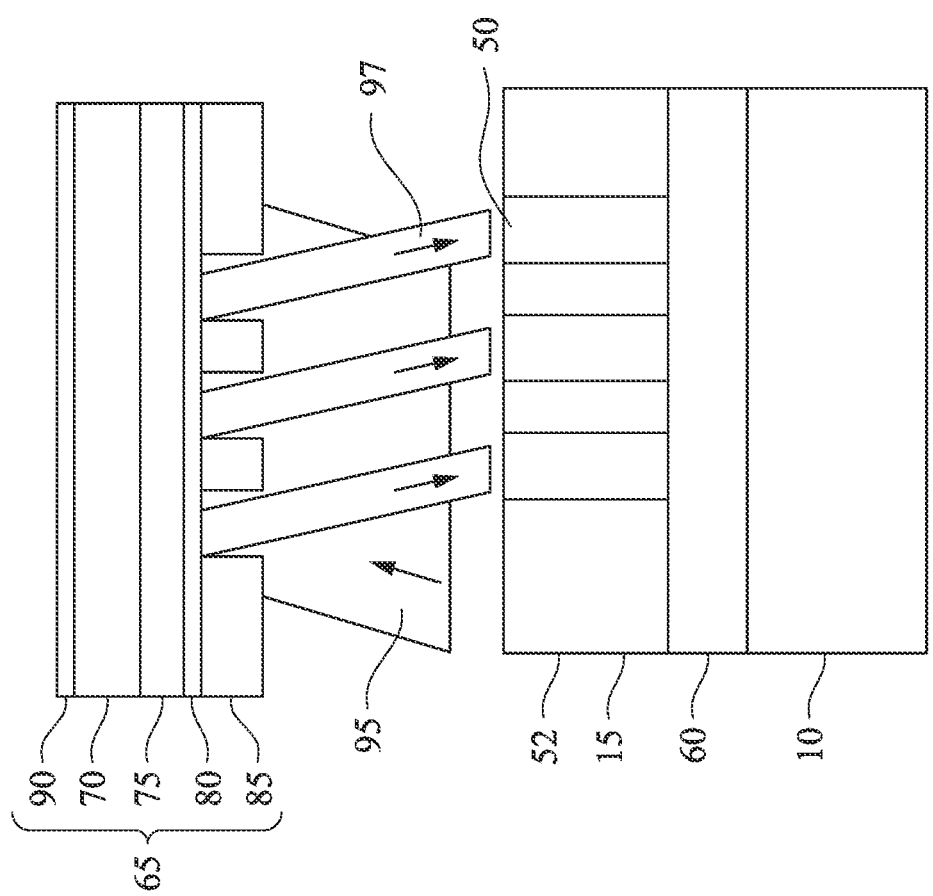

The photoresist layer 15 is subsequently selectively exposed to actinic radiation 45 to form exposed regions 50 and unexposed regions 52 in the photoresist layer, as shown in FIGS. 13A and 13B, and described herein in relation to FIGS. 3A and 3B. As explained herein the photoresist is a negative photoresist, wherein polymer crosslinking occurs in the exposed regions 50 in some embodiments.

Figure 14:
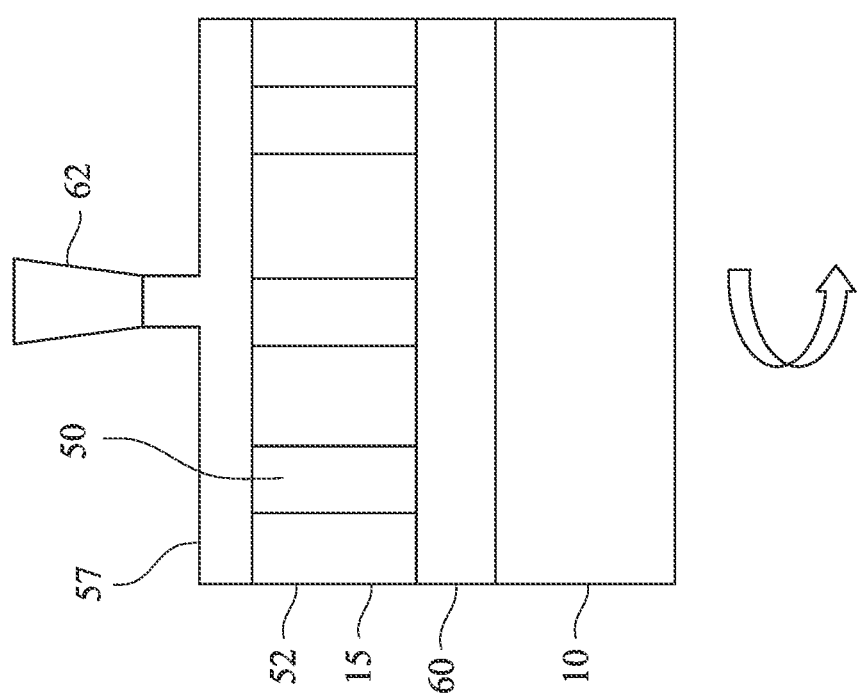
FIG. 14 shows a process stage of a sequential operation according to an embodiment of the disclosure.
Figure 15:
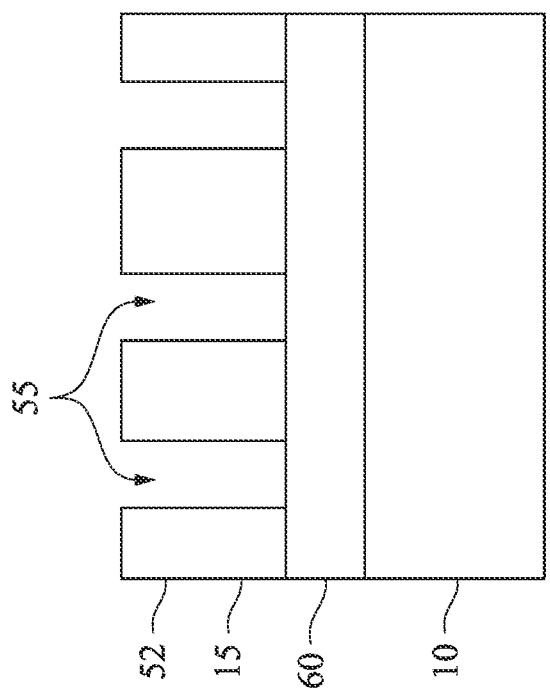
FIG. 15 shows a process stage of a sequential operation according to an embodiment of the disclosure.

As shown in FIG. 14, the exposed photoresist regions 50 are developed by dispensing developer 57 from a dispenser 62 to form a pattern of photoresist openings 55, as shown in FIG. 15. The development operation is similar to that explained with reference to FIGS. 4 and 5, herein.

Figure 16:
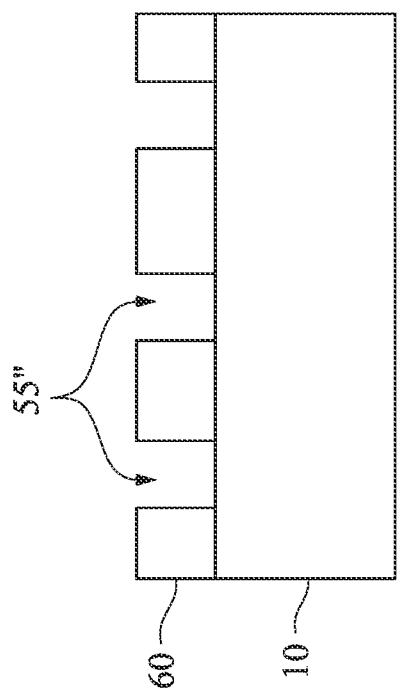
FIG. 16 shows a process stage of a sequential operation according to an embodiment of the disclosure.

Then as shown in FIG. 16, the pattern 55 in the photoresist layer 15 is transferred to the layer to be patterned 60 using an etching operation and the photoresist layer is removed, as explained with reference to FIG. 6 to form pattern 55" in the layer to be patterned 60.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof are formed, according to embodiments of the disclosure.

The novel compositions, photolithographic patterning methods, and semiconductor manufacturing methods according to the present disclosure provide higher semiconductor device feature resolution and density at higher wafer exposure throughput with reduced defects in a higher efficiency process than conventional patterning techniques. The novel photoresist compositions and methods provide improved etching resistance of the photoresist layer.

An embodiment of the disclosure is a method of forming a pattern in a photoresist layer, including forming a photoresist layer over a substrate, and selectively exposing the photoresist layer to actinic radiation to form a latent pattern. The latent pattern is developed by applying a developer to the selectively exposed photoresist layer to form a pattern. The photoresist layer includes a photoresist composition comprising a polymer, wherein the polymer has a formula:

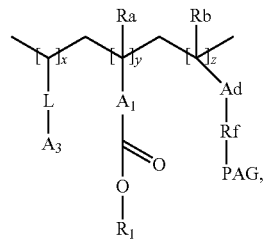

where $A_1$, $A_2$, and L are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, wherein $A_1$ and $A_2$ are not both direct bonds, wherein $A_1$ and $A_2$ are unsubstituted or substituted with a halogen, carbonyl group, or hydroxyl group; $A_3$ is a C6-C14 aromatic group, wherein $A_3$ is unsubstituted or substituted with a halogen, carbonyl group, or hydroxyl group; $R_1$ is an acid labile group; Ra and Rb are independently H or a C1-C3 alkyl group; $R_f$ is a direct bond or a C1-C5 fluorocarbon; PAG is a photoacid generator; and $0 \leq x/(x+y+z) \leq 1$, $0 \leq y/(x+y+z) \leq 1$, and $0 \leq z/(x+y+z) \leq 1$. In an embodiment, $A_1$, $A_2$, and $A_3$ are independently a chain, ring, or three-dimensional structure. In an embodiment, at least one of $A_1$, $A_2$, and $A_3$ is a three-dimensional adamantyl or norbornyl structure. In an embodiment, $R_1$ is a C4-C15 alkyl group, a C4-C15 cycloalkyl group, a C4-C15 hydroxylalkyl group, a C4-C15 alkoxy group, or a C4-C15 alkoxyl alkyl group. In an embodiment, the photoacid generator includes a triphenylsulfonium group and a sulfonate group. In an embodiment, $R_f$ is a perfluorinated group. In an embodiment, $A_3$ is a phenol group, a hydroxynaphthalene group, or a hydroxyanthracene group. In an embodiment, $A_1$, $A_2$, and $A_3$ are independently a phenyl group or a naphthalenyl group. In an embodiment, L is a direct bond and $A_3$ is a p-phenol group, and $0.2 \leq x/(x+y+z) \leq 0.5$. In an embodiment, $A_1$ is not a direct bond and $0.2 \leq y/(x+y+z) \leq 0.7$. In an embodiment, the photoresist composition includes a solvent. In an embodiment, the polymer has a weight average molecular weight ranging from 500 to 1,000,000. In an embodiment, the polymer has a weight average molecular weight ranging from 2,000 to 250,000. In an embodiment, the photoresist composition includes a photoactive compound. In an embodiment, the photoactive compound is a photoacid generator. In an embodiment, $A_2$ is not a direct bond and $0.05 \leq z/(x+y+z) \leq 0.5$. In an embodiment, $0.1 \leq x/(x+y+z) \leq 0.5$. In an embodiment, $A_1$ and $A_2$ are not direct bonds and $0.2 \leq y/(x+y+z) \leq 0.7$ and $0.05 \leq z/(x+y+z) \leq 0.5$. In an embodiment, $A_1$ is not a direct bond and $0.2 \leq y/(x+y+z) \leq 0.7$ and $0.1 \leq x/(x+y+z) \leq 0.5$. In an embodiment, $A_1$ and $A_2$ are not direct bonds and $0.2 \leq y/(x+y+z) \leq 0.7$, $0.05 \leq z/(x+y+z) \leq 0.5$, and $0.1 \leq x/(x+y+z) \leq 0.5$. In an embodiment, the photoresist composition includes a photoactive compound, $A_1$ is not a direct bond, and $0.2 \leq y/(x+y+z) \leq 0.7$. In an embodiment, the photoresist composition includes a photoactive compound and $0.1 \leq x/(x+y+z) \leq 0.5$. In an embodiment, the photoresist composition includes a photoactive compound, $A_1$ is not a direct bond and $0.2 \leq y/(x+y+z) \leq 0.7$ and $0.1 \leq x/(x+y+z) \leq 0.5$. In an embodiment, the photoresist composition includes a metal oxide nanoparticle and one or more organic ligands. In an embodiment, the actinic radiation is extreme ultraviolet radiation. In an embodiment, the method includes after selectively exposing the photoresist layer to actinic radiation to form a latent pattern and before developing the latent pattern heating the photoresist layer. In an embodiment, the method includes heating the photoresist layer before selectively exposing the photoresist layer to actinic radiation to form a latent pattern.

Another embodiment of the disclosure is a method of manufacturing a semiconductor device, including forming a photoresist layer over a substrate. The photoresist layer includes a photoresist composition, including a polymer having a formula:

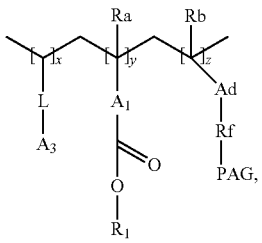

where $A_1$, $A_2$, and L are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, wherein $A_1$ and $A_2$ are not both direct bonds, wherein $A_1$ and $A_2$ are unsubstituted or substituted with a halogen, carbonyl group, or hydroxyl group; $A_3$ is a C6-C14 aromatic group, wherein $A_3$ is unsubstituted or substituted with a halogen, carbonyl group, or hydroxyl group; $R_1$ is an acid labile group; Ra and Rb are independently H or C1-C3 alkyl group; $R_f$ is a direct bond or a C1-C5 fluorocarbon; PAG is a photoacid generator; and $0 \leq x/(x+y+z) \leq 1$, $0 \leq y/(x+y+z) \leq 1$, and $0 \leq z/(x+y+z) \leq 1$. A latent pattern is formed in the photoresist layer by patternwise exposing the photoresist layer to actinic radiation. A developer is applied to the patternwise exposed photoresist layer to form a pattern exposing a portion of the substrate. The pattern is extended into substrate. In an embodiment, the extending the pattern into the substrate includes etching the substrate. In an embodiment, the method includes heating the photoresist layer at a temperature of 50° C. to 160° C. after the forming a latent pattern and before the applying a developer. In an embodiment, the method includes heating the photoresist layer at a temperature of 40° C. to 120° C. before the forming a latent pattern. In an embodiment, the actinic radiation is extreme ultraviolet radiation.

Another embodiment of the disclosure is a photoresist composition, including a polymer, wherein the polymer has a formula:

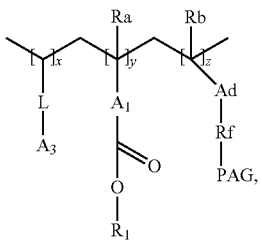

where $A_1$, $A_2$, and L are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, wherein $A_1$ and $A_2$ are not both direct bonds, wherein $A_1$ and $A_2$ are unsubstituted or substituted with a halogen, carbonyl group, or hydroxyl group; $A_3$ is a C6-C14 aromatic group, wherein $A_3$ is unsubstituted or substituted with a halogen, carbonyl group, or hydroxyl group; $R_1$ is an acid labile group; Ra and Rb are independently H or a C1-C3 alkyl group; $R_f$ is a direct bond or a C1-C5 fluorocarbon; PAG is a photoacid generator; and $0 \leq x/(x+y+z) \leq 1$, $0 \leq y/(x+y+z) \leq 1$, and $0 \leq z/(x+y+z) \leq 1$. In an embodiment, $A_1$, $A_2$, and $A_3$ are independently a chain, ring, or three-dimensional structure. In an embodiment, at least one of $A_1$, $A_2$, and $A_3$ is a three-dimensional structure selected from an adamantyl or norbornyl structure. In an embodiment, $R_1$ is a C4-C15 alkyl group, a C4-C15 cycloalkyl group, a C4-C15 hydroxylalkyl group, a C4-C15 alkoxy group, or a C4-C15 alkoxyl alkyl group. In an embodiment, the photoacid generator includes a triphenylsulfonium group and a sulfonate group. In an embodiment, $R_f$ is a perfluorinated group. In an embodiment, $A_3$ is a phenol group, a hydroxynaphthalene group, or a hydroxyanthracene group. In an embodiment, $A_1$, $A_2$, and $A_3$ are independently a phenyl group or a naphthalenyl group. In an embodiment, the photoresist composition includes a solvent. In an embodiment, the polymer has a weight average molecular weight ranging from 500 to 1,000,000. In an embodiment, the polymer has a weight average molecular weight ranging from 2,000 to 250,000. In an embodiment, the photoresist composition includes a photoactive compound. In an embodiment, the photoactive compound is a photoacid generator. In an embodiment, L is a direct bond, $A_3$ is a p-phenol group, and $0.2 \leq x/(x+y+z) \leq 0.5$. In an embodiment, $A_1$ is not a direct bond and $0.2 \leq y/(x+y+z) \leq 0.7$. In an embodiment, $A_2$ is not a direct bond and $0.05 \leq z/(x+y+z) \leq 0.5$. In an embodiment, $0.1 \leq x/(x+y+z) \leq 0.5$. In an embodiment, $A_1$ and $A_2$ are not direct bonds and $0.2 \leq y/(x+y+z) \leq 0.7$ and $0.05 \leq z/(x+y+z) \leq 0.5$. In an embodiment, $A_1$ is not a direct bond and $0.2 \leq y/(x+y+z) \leq 0.7$ and $0.1 \leq x/(x+y+z) \leq 0.5$. In an embodiment, $A_1$ and $A_2$ are not direct bonds and $0.2 \leq y/(x+y+z) \leq 0.7$, $0.05 \leq z/(x+y+z) \leq 0.5$, and $0.1 \leq x/(x+y+z) \leq 0.5$. In an embodiment, the photoresist composition includes a photoactive compound, $A_1$ is not a direct bond, and $0.2 \leq y/(x+y+z) \leq 0.7$. In an embodiment, the photoresist composition includes a photoactive compound, wherein $0.1 \leq x/(x+y+z) \leq 0.5$. In an embodiment, the photoresist composition includes a photoactive compound, $A_1$ is not a direct bond, and $0.2 \leq y/(x+y+z) \leq 0.7$ and $0.1 \leq x/(x+y+z) \leq 0.5$. In an embodiment, the photoresist composition includes a metal oxide nanoparticle and one or more organic ligands.

Another embodiment of the disclosure is a method of patterning a photoresist layer, including depositing a photoresist layer over a substrate. A latent pattern is formed in the photoresist layer by selectively exposing the photoresist layer to actinic radiation. A portion of the selectively exposed photoresist layer is removed by applying a developer to the selectively exposed photoresist layer to form a pattern in the photoresist layer. The photoresist layer includes a photoresist composition including a polymer, wherein the polymer has a formula:

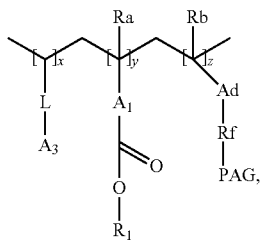

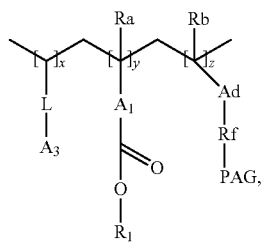

where $A_1$, $A_2$, and L are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, wherein $A_1$ and $A_2$ are not both direct bonds, wherein $A_1$ and $A_2$ are unsubstituted or substituted with a halogen, carbonyl group, or hydroxyl group; $A_3$ is a C6-C14 aromatic group, wherein $A_3$ is unsubstituted or substituted with a halogen, carbonyl group, or hydroxyl group; $R_1$ is an acid labile group; Ra and Rb are independently H or a C1-C3 alkyl group; $R_f$ is a direct bond or a C1-C5 fluorocarbon; PAG is a photoacid generator; and $0<x/(x+y+z)<1$, $0<y/(x+y+z)<1$, and $0<z/(x+y+z)<1$. In an embodiment, a portion of the photoresist layer that is exposed to the actinic radiation is the portion of the selectively exposed photoresist layer removed by applying the developer. In an embodiment, $A_1$, $A_2$, and $A_3$ are independently a chain, ring, or three-dimensional structure. In an embodiment, at least one of $A_1$, $A_2$, and $A_3$ is a three-dimensional structure selected from an adamantyl or norbornyl structure. In an embodiment, $R_1$ is a C4-C15 alkyl group, a C4-C15 cycloalkyl group, a C4-C15 hydroxylalkyl group, a C4-C15 alkoxy group, or a C4-C15 alkoxyl alkyl group. In an embodiment, the photoacid generator includes a triphenylsulfonium group and a sulfonate group. In an embodiment, $R_f$ is a perfluorinated group. In an embodiment, $A_3$ is a phenol group, a hydroxynaphthalene group, or a hydroxyanthracene group. In an embodiment, $A_1$, $A_2$, and $A_3$ are independently a phenyl group or a naphthalenyl group. In an embodiment, L is a direct bond and $A_3$ is a p-phenol group, and $0.2 \leq x/(x+y+z) \leq 0.5$. In an embodiment, $A_1$ is not a direct bond and $0.2 \leq y/(x+y+z) \leq 0.7$. In an embodiment, $0.1 \leq x/(x+y+z) \leq 0.5$. In an embodiment, $A_1$ and $A_2$ are not direct bonds and $0.2 \leq y/(x+y+z) \leq 0.7$ and $0.05 \leq z/(x+y+z) \leq 0.5$. In an embodiment, $A_1$ is not a direct bond and $0.2 \leq y/(x+y+z) \leq 0.7$ and $0.1 \leq x/(x+y+z) \leq 0.5$. In an embodiment, $A_1$ and $A_2$ are not direct bonds and $0.2 \leq y/(x+y+z) \leq 0.7$, $0.05 \leq z/(x+y+z) \leq 0.5$, and $0.1 \leq x/(x+y+z) \leq 0.5$. In an embodiment, the photoresist composition includes a photoactive compound, $A_1$ is not a direct bond, and $0.2 \leq y/(x+y+z) \leq 0.7$. In an embodiment, the photoresist composition includes a photoactive compound and $0.1 \leq x/(x+y+z) \leq 0.5$. In an embodiment, the photoresist composition includes a photoactive compound, $A_1$ is not a direct bond, and $0.2 \leq y/(x+y+z) \leq 0.7$ and $0.1 \leq x/(x+y+z) \leq 0.5$.

Another embodiment of the disclosure is a photoresist composition, including a polymer, wherein the polymer has a formula:

where $A_1$, $A_2$, and L are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, wherein $A_1$ and $A_2$ are not both direct bonds, wherein $A_1$ and $A_2$ are unsubstituted or substituted with a halogen, carbonyl group, or hydroxyl group; $A_3$ is a C6-C14 aromatic group, wherein $A_3$ is unsubstituted or substituted with a halogen, carbonyl group, or hydroxyl group; $R_1$ is an acid labile group; Ra and Rb are independently H or a C1-C3 alkyl group; $R_f$ is a direct bond or a C1-C5 fluorocarbon; PAG is a photoacid generator; and $0<x/(x+y+z)<1$, $0<y/(x+y+z)<1$, and $0<z/(x+y+z)<1$. In an embodiment, $A_1$, $A_2$, and $A_3$ are independently a chain, ring, or three-dimensional structure. In an embodiment, at least one of $A_1$, $A_2$, and $A_3$ is a three-dimensional structure selected from an adamantyl or norbornyl structure. In an embodiment, $R_1$ is a C4-C15 alkyl group, a C4-C15 cycloalkyl group, a C4-C15 hydroxylalkyl group, a C4-C15 alkoxy group, or a C4-C15 alkoxyl alkyl group. In an embodiment, the photoacid generator includes a triphenylsulfonium group and a sulfonate group. In an embodiment, $R_f$ is a perfluorinated group. In an embodiment, $A_3$ is a phenol group, a hydroxynaphthalene group, or a hydroxyanthracene group. In an embodiment, $A_1$, $A_2$, and $A_3$ are independently a phenyl group or a naphthalenyl group. In an embodiment, the photoresist composition includes a solvent. In an embodiment, the polymer has a weight average molecular weight ranging from 500 to 1,000,000. In an embodiment, the polymer has a weight average molecular weight ranging from 2,000 to 250,000. In an embodiment, the photoresist composition includes a photoactive compound. In an embodiment, the photoactive compound is a photoacid generator. In an embodiment, L is a direct bond, $A_3$ is a p-phenol group, and $0.2 \leq x/(x+y+z) \leq 0.5$. In an embodiment, $A_1$ is not a direct bond and $0.2 \leq y/(x+y+z) \leq 0.7$. In an embodiment, $A_2$ is not a direct bond and $0.05 \leq z/(x+y+z) \leq 0.5$. In an embodiment, $0.1 \leq x/(x+y+z) \leq 0.5$. In an embodiment, $A_1$ and $A_2$ are not direct bonds and $0.2 \leq y/(x+y+z) \leq 0.7$ and $0.05 \leq z/(x+y+z) \leq 0.5$. In an embodiment, $A_1$ is not a direct bond and $0.2 \leq y/(x+y+z) \leq 0.7$ and $0.1 \leq x/(x+y+z) \leq 0.5$. In an embodiment, $A_1$ and $A_2$ are not direct bonds and $0.2 \leq y/(x+y+z) \leq 0.7$, $0.05 \leq z/(x+y+z) \leq 0.5$, and $0.1 \leq x/(x+y+z) \leq 0.5$. In an embodiment, the photoresist composition includes a photoactive compound, $A_1$ is not a direct bond, and $0.2 \leq y/(x+y+z) \leq 0.7$. In an embodiment, the photoresist composition includes a photoactive compound and $0.1 \leq x/(x+y+z) \leq 0.5$. In an embodiment, the photoresist composition includes a photoactive compound, $A_1$ is not a direct bond, and $0.2 \leq y/(x+y+z) \leq 0.7$ and $0.1 \leq x/(x+y+z) \leq 0.5$. In an embodiment, the photoresist composition includes a metal oxide nanoparticle and one or more organic ligands.

Another embodiment of the disclosure is a polymer composition, including a polymer having a formula:

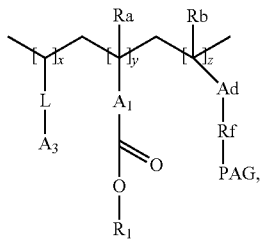

where $A_1$, $A_2$, and L are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, wherein $A_1$ and $A_2$ are not both direct bonds, wherein $A_1$ and $A_2$ are unsubstituted or substituted with a halogen, carbonyl group, or hydroxyl group; $A_3$ is a C6-C14 aromatic group, wherein $A_3$ is unsubstituted or substituted with a halogen, carbonyl group, or hydroxyl group; wherein at least one of $A_1$, $A_2$, and $A_3$ is an adamantyl group, a norbornyl group, a phenol group, a hydroxynaphthalene group, a hydroxyanthracene group, a phenyl group, or a naphthalenyl group; $R_1$ is an acid labile group; Ra and Rb are independently H or a C1-C3 alkyl group; $R_f$ is a direct bond or a C1-C5 fluorocarbon; PAG includes a triphenylsulfonium group and a sulfonate group; and $0<x/(x+y+z)<1$, $0<y/(x+y+z)<1$, and $0<z/(x+y+z)<1$. In an embodiment, $R_1$ is a C4-C15 alkyl group, a C4-C15 cycloalkyl group, a C4-C15 hydroxylalkyl group, a C4-C15 alkoxy group, or a C4-C15 alkoxyl alkyl group. In an embodiment, $R_f$ is a perfluorinated group. In an embodiment, the polymer has a weight average molecular weight ranging from 500 to 1,000,000. In an embodiment, the polymer has a weight average molecular weight ranging from 2,000 to 250,000. In an embodiment, L is a direct bond, $A_3$ is a p-phenol group, and $0.2 \leq x/(x+y+z) \leq 0.5$. In an embodiment, $A_1$ is not a direct bond and $0.2 \leq y/(x+y+z) \leq 0.7$. In an embodiment, $A_2$ is not a direct bond and $0.05 \leq z/(x+y+z) \leq 0.5$. In an embodiment, $0.1 \leq x/(x+y+z) \leq 0.5$. In an embodiment, $A_1$ and $A_2$ are not direct bonds, $0.2 \leq y/(x+y+z) \leq 0.7$, and $0.05 \leq z/(x+y+z) \leq 0.5$. In an embodiment, $A_1$ is not a direct bond, $0.2 \leq y/(x+y+z) \leq 0.7$, and $0.1 \leq x/(x+y+z) \leq 0.5$. In an embodiment, $A_1$ and $A_2$ are not direct bonds, $0.2 \leq y/(x+y+z) \leq 0.7$, $0.05 \leq z/(x+y+z) \leq 0.5$, and $0.1 \leq x/(x+y+z) \leq 0.5$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A polymer composition, comprising:
a polymer having a formula:

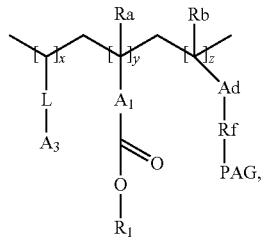

where $A_1$, $A_2$, and L are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, wherein $A_1$ and $A_2$ are not both direct bonds, wherein $A_1$ and $A_2$ are unsubstituted or substituted with a halogen, carbonyl group, or hydroxyl group;

$A_3$ is a C6-C14 aromatic group, wherein $A_3$ is unsubstituted or substituted with a halogen, carbonyl group, or hydroxyl group;

wherein at least one of $A_1$, $A_2$, and $A_3$ is an adamantyl group, a norbornyl group, a phenol group, a hydroxynaphthalene group, a hydroxyanthracene group, a phenyl group, or a naphthalenyl group;

$R_1$ is an acid labile group;

Ra and Rb are independently H or a C1-C3 alkyl group;

Rf is a direct bond or a C1-C5 fluorocarbon;

PAG includes a triphenylsulfonium group and a sulfonate group; and $0<x/(x+y+z)<1$, $0<y/(x+y+z)<1$, and $0<z/(x+y+z)<1$.

2. The polymer composition of claim 1, wherein $R_1$ is a C4-C15 alkyl group, a C4-C15 cycloalkyl group, a C4-C15 hydroxylalkyl group, a C4-C15 alkoxy group, or a C4-C15 alkoxyl alkyl group.

3. The polymer composition of claim 1, wherein $R_f$ is a perfluorinated group.

4. The polymer composition of claim 1, wherein the polymer has a weight average molecular weight ranging from 500 to 1,000,000.

5. The polymer composition of claim 4, wherein the polymer has a weight average molecular weight ranging from 2,000 to 250,000.

6. The polymer composition of claim 1, wherein L is a direct bond, $A_3$ is a p-phenol group, and $0.2 \leq x/(x+y+z) \leq 0.5$.

7. The polymer composition of claim 1, wherein $A_1$ is not a direct bond and $0.2 \leq y/(x+y+z) \leq 0.7$.

8. The polymer composition of claim 1, wherein $A_2$ is not a direct bond and $0.05 \leq z/(x+y+z) \leq 0.5$.

9. The polymer composition of claim 1, wherein $0.1 \leq x/(x+y+z) \leq 0.5$.

10. The polymer composition of claim 1, wherein $A_1$ is not a direct bond and $0.2 \leq y/(x+y+z) \leq 0.7$ and $0.1 \leq x/(x+y+z) \leq 0.5$.

11. A composition, comprising:
a polymer,
wherein the polymer has a formula:

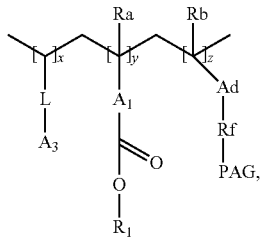

where L is a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group;

$A_1$ and $A_2$ are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, and $A_1$ and $A_2$ are unsubstituted or substituted with a halogen, carbonyl group, or hydroxyl group;

$A_3$ is a phenol group, hydroxynaphthalene group, or hydroxyanthracene group;

$R_1$ is an acid labile group;

Ra and Rb are independently H or a C1-C3 alkyl group;

Rf is a direct bond or a C1-C5 fluorocarbon;

PAG is a photoacid generator; and $0.2 \leq y/(x+y+z) \leq 0.7$, $0.05 \leq z/(x+y+z) \leq 0.5$, and $0.1 \leq x/(x+y+z) \leq 0.5$.

12. The composition of claim 11, wherein $A_1$ and $A_2$ are independently a chain, ring, or three-dimensional structure.

13. The composition of claim 12, wherein at least one of $A_1$ and $A_2$ is a three-dimensional structure selected from an adamantyl or a norbornyl structure.

14. The composition of claim 11, wherein $R_1$ is a C4-C15 alkyl group, a C4-C15 cycloalkyl group, a C4-C15 hydroxylalkyl group, a C4-C15 alkoxy group, or a C4-C15 alkoxyl alkyl group.

15. The composition of claim 11, wherein the photoacid generator includes a triphenylsulfonium group and a sulfonate group.

16. The composition of claim 11, wherein $R_f$ is a perfluorinated group.

17. The composition of claim 11, wherein the polymer has a weight average molecular weight ranging from 500 to 1,000,000.

18. A method, comprising:
depositing a photoresist layer over a substrate,
wherein the photoresist layer comprises a composition, comprising:
a polymer having a formula:

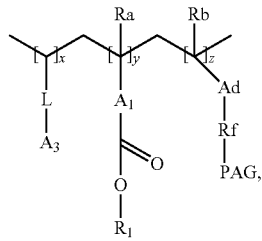

where $A_1$, $A_2$, and L are independently a direct bond, a C4-C30 aromatic group, a C4-C30 alkyl group, a C4-C30 cycloalkyl group, a C4-C30 hydroxylalkyl group, a C4-C30 alkoxy group, a C4-C30 alkoxyl alkyl group, a C4-C30 acetyl group, a C4-C30 acetylalkyl group, a C4-C30 alkyl carboxyl group, a C4-C30 cycloalkyl carboxyl group, a C4-C30 saturated or unsaturated hydrocarbon ring, or a C4-C30 heterocyclic group, wherein $A_1$ and $A_2$ are not both direct bonds, wherein $A_1$ and $A_2$ are unsubstituted or substituted with a halogen, carbonyl group, or hydroxyl group;

$A_3$ is a C6-C14 aromatic group, wherein $A_3$ is unsubstituted or substituted with a halogen, carbonyl group, or hydroxyl group;

wherein at least one of $A_1$, $A_2$, and $A_3$ is an adamantyl group, a norbornyl group, a phenol group, a hydroxynaphthalene group, a hydroxyanthracene group, a phenyl group, or a naphthalenyl group;

$R_1$ is an acid labile group;

Ra and Rb are independently H or a C1-C3 alkyl group;

Rf is a direct bond or a C1-C5 fluorocarbon; and

PAG includes a triphenylsulfonium group and a sulfonate group; and $0 < x/(x+y+z) < 1$, $0 < y/(x+y+z) < 1$, and $0 < z/(x+y+z) < 1$; and a photoactive compound;

selectively exposing the photoresist layer to actinic radiation; and removing a portion of the photoresist layer exposed to the actinic radiation to form a pattern exposing portions of the substrate.

19. The method according to claim 18, further comprising etching exposed portions of the substrate to extend the pattern in the photoresist layer into the substrate.

20. The method according to claim 18, wherein $A_3$ is a phenol group, hydroxynaphthalene group, or hydroxyanthracene group.

* * * * *